United States Patent
Lin

[19]

[11] Patent Number: 6,077,773
[45] Date of Patent: Jun. 20, 2000

[54] DAMASCENE PROCESS FOR REDUCED FEATURE SIZE

[75] Inventor: Ming-Ren Lin, Cupertino, Calif.

[73] Assignee: Advanced Micro Devices, Inc., Sunnyvale, Calif.

[21] Appl. No.: 08/974,687

[22] Filed: Nov. 19, 1997

Related U.S. Application Data

[62] Division of application No. 08/800,148, Feb. 13, 1997, Pat. No. 5,753,967, which is a continuation of application No. 08/528,279, Sep. 14, 1995.

[51] Int. Cl.$^7$ .............................................. H01L 21/4763
[52] U.S. Cl. ..................... 438/637; 438/638; 438/639; 438/640; 438/666; 438/668
[58] Field of Search ................... 438/637, 638, 438/639, 640, 666, 668

[56] References Cited

U.S. PATENT DOCUMENTS

| | | |
|---|---|---|
| 4,641,420 | 2/1987 | Lee .............................................. 29/511 |
| 4,944,836 | 7/1990 | Beyer et al. . |
| 5,117,273 | 5/1992 | Stark et al. . |
| 5,262,354 | 11/1993 | Cote et al. . |
| 5,488,242 | 1/1996 | Sunouchi et al. . |
| 5,602,423 | 2/1997 | Jain . |

FOREIGN PATENT DOCUMENTS

| | | |
|---|---|---|
| 0257948 | 3/1988 | European Pat. Off. . |
| 0265638 | 5/1988 | European Pat. Off. . |
| 0435187 | 7/1991 | European Pat. Off. . |
| 0655773 | 5/1995 | European Pat. Off. . |
| 63-253647 | 10/1988 | Japan .............................. H01L 21/90 |
| 4211148 | 8/1992 | Japan . |
| 629406 | 2/1994 | Japan . |
| 2251722 | 7/1992 | United Kingdom .......... H01L 23/535 |

OTHER PUBLICATIONS

"Method to produce sizes in openings in photo images smaller than lithographic minimum size", IBM Technical Disclosure Bulletin, vol. 29, No. 3, Aug. 1986, pp. 1328.

Kaanta et al., Dual Damascene: A ULSI Wiring Technology, Proceedings of the 8th International IEEE VLSI Multilevel Interconnection Conference, Jun. 11–12, 1991, pp. 144–152.

*Primary Examiner*—John F. Niebling
*Assistant Examiner*—David A. Zarneke

[57] ABSTRACT

Submicron contacts/vias and trenches are provided in a dielectric layer by forming an opening having an initial dimension and reducing the initial dimension by depositing a second dielectric material in the opening.

22 Claims, 3 Drawing Sheets

DAMASCENE PROCESS FOR REDUCED FEATURE SIZE

This application is a division of application Ser. No. 08/800,148 filed Feb. 13, 1997, now U.S. Pat. No. 5,753,967, which is a continuation of application Ser. No. 08/528,279 filed Sep. 14, 1995.

TECHNICAL FIELD

The present invention relates to a semiconductor device containing an interconnection structure comprising conductive wiring and conductive contacts/vias in a substrate, and to a damascene process for forming an interconnection structure. The invention has particular application in submicron circuit manufacturing.

BACKGROUND ART

The escalating requirements for increased densification and performance in ultra-large scale integration semiconductor wiring require responsive changes in interconnection technology. High density demands for ultra-large scale integration semiconductor wiring require planarized conductive patterns comprising conductive lines and/or interwire spacings of less than 0.35 microns.

A traditional method for forming interconnection structures comprises the use of a subtractive etching or etch back step as the primary metal patterning technique. Such a traditional method involves the formation of a dielectric layer on a semiconductor substrate, typically monocrystalline silicon, with conductive contacts/vias formed in the insulating layer. A metal layer, such as tungsten, aluminum, or alloys thereof, is deposited on the insulating layer, and a photoresist mask is formed on the metal layer having a pattern corresponding to the desired conductive pattern. The metal layer is then etched through the photoresist mask to form the conductive pattern. A dielectric layer is then applied to the resulting conductive pattern filling in the interwiring spaces between the conductive lines.

There are various problems attendant upon the traditional etch back technique. For example, it is difficult to form an adequately planarized layer subsequent to filling in the interwiring spacings between the conductive lines, as by conventional etching and chemical-mechanical polishing (CMP) planarization techniques, particularly with reducer interwiring spacings. In addition, the traditional etch back technique often results in the generation of voids in the filled-in interwiring spacings. Additional difficulties include trapping of impurities of volatile materials in the interwiring spacings thereby exposing the semiconductor device to potential damage. Moreover, it is difficult to provide adequate step courage using the traditional etch back technique.

Prior attempts to overcome the disadvantages of the traditional etch back technique involve the application of damascene to form a conductive pattern. Damascene is an art which has been employed for centuries in the fabrication of jewelry, and has recently been adapted for application in the semiconductor industry. Damascene basically involves the formation of a trench which is filled with a metal. Thus, damascene differs from the traditional etch back techniques of providing an interconnection structure by forming a pattern of trenches in a dielectric layer, which trenches are filled in with metal to form the conductive pattern followed by planarization vis-à-vis the traditional etch back technique of depositing a metal layer, forming a conductive pattern with interwiring spacings, and filling in the interwiring spacings with dielectric material.

In co-pending application Ser. No. 08/320,516 filed on Oct. 11, 1994, prior art single and dual damascene techniques are disclosed, in addition to several improved dual damascene techniques for greater accuracy in forming fine line patterns with minimal interwiring spacings. However, there exists a need for a simplified method of accurately forming interconnection structures with minimal dimensions, e.g., as small as about 0.15 microns for vias and trenches.

DISCLOSURE OF THE INVENTION

An object of the present invention is a highly integrated semiconductor device containing an interconnection structure of planarized layers having minimal interwiring spacing.

Another object is an improve damascene method for forming an interconnection structure having a conductive pattern wherein the conductive lines and/or interwiring spacing is less 0.35 microns.

Additional objects, advantage and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a semiconductor device comprising: a first dielectric layer, comprising a first dielectric material, having an upper surface, a lower surface, and a first opening extending through the first dielectric layer from the upper surface to the lower surface, wherein the first opening has a first dimension defined by a first sidewall having a finite thickness comprising a second dielectric material.

A further aspect of the invention is a semiconductor device comprising: a first dielectric layer, comprising a first dielectric material, having an upper surface, a lower surface, and a first opening extending through the first dielectric layer from the upper surface to the lower surface, wherein the first opening has a first dimension defined by a first sidewall having a finite thickness comprising a second dielectric material; a second dielectric layer, comprising a third dielectric material, formed above the first dielectric layer, wherein the second dielectric layer comprises an upper surface, a lower surface on the first dielectric layer, a second opening through the second dielectric layer extending from the upper surface to the lower surface of the second dielectric layer and communicating with the first opening, and having a second dimension, greater than the first dimension, and wherein the second dimension is defined by a sidewall having a finite thickness comprising the second dielectric material.

Another aspect of the invention is a method of manufacturing a semiconductor device, which method comprises: forming a first dielectric layer, comprising a first dielectric material, having an upper surface and a lower surface; forming a first opening through the first dielectric layer extending from the upper surface to the lower surface and having an initial first dimension defined by side surfaces within the first dielectric layer; depositing a second dielectric material, in the first opening on the side surfaces to form a first sidewall to reduce the initial first dimension of the first opening to a final first dimension by the first sidewall.

A further aspect of the invention is a method of manufacturing a semiconductor device, which method comprises:

forming a first dielectric layer, comprising a first dielectric material, having an upper surface and a lower surface; forming a second dielectric layer, comprising a third dielectric material, on the first dielectric layer, the second dielectric layer having an upper surface and a lower surface on the first dielectric layer; forming openings through the first and second dielectric layers, including a first opening through the first dielectric layer extending from the upper surface to the lower surface and having an initial first dimension defined by side surfaces within the first dielectric layer and a second opening through the second dielectric layer extending from the upper surface to the lower surface of the second dielectric layer, wherein the second opening communicates with the first opening, and the second opening has an initial second dimension defined by side surfaces within the second dielectric layer; depositing a second dielectric material in the first and second openings to form a sidewall to reduce the initial first and second dimensions to a final first and second dimensions less than the initial first and second dimensions, so that the final first and second dimensions are defined by the sidewall.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
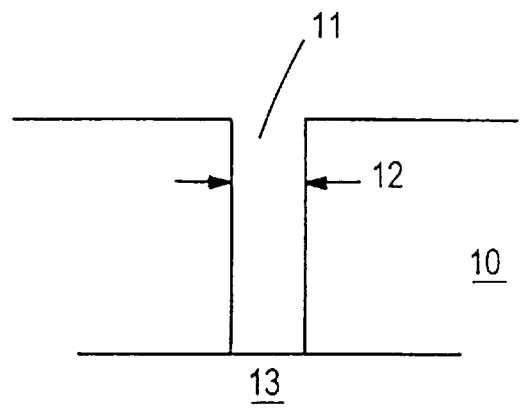
FIG. 1 is a cross-sectional view of a via/contact or trench formed by a conventional single damascene technique.

The present invention is directed to a semiconductor device and to a method of manufacturing the semiconductor device, wherein the semiconductor device comprises a substrate with, preferably, a plurality of planarized layers vertically formed thereon, and an interconnection structure comprising conductive contacts/vias and trenches, wherein the profiles of the conductive contacts/vias and trenches are controlled with great accuracy to achieve minimal interwiring spacing as required by high density design rule, such as less than about 0.35 microns. It is particularly preferred to provide interwiring spacings as low as about 0.15 microns. In accordance with the present invention, a semiconductor device having such accurate minimal dimensions is achieved by a process which involves a damascene technique. The present invention also provides a simplified technique for accurately forming conductive vias between conductive patterns, or a conductive contact to an active region on a semiconductor device, or for forming trenches, which simplified technique is applicable to semiconductor devices having relatively large geometry. Due to its simplification, the present invention enables a cost reduction and avoids the necessity of providing certain expensive photolithographic equipment.

As the design requirements for interconnection patterns become more severe in requiring minimal dimensions, such as vias having a dimension less than about 0.35 microns, particularly less than about 0.25 microns, the ability of conventional photolithographic techniques to satisfy such demands with satisfactory accuracy becomes increasingly more difficult. The limitation on achieving such fine dimensions resides in the inability of conventional photolithographic and etching techniques to satisfy the accuracy requirements for such fine patterns. Conventionally, in forming patterns having a small dimension, such as about 0.30 to about 0.40 microns or greater, I-line photolithography is employed. As the maximum dimension is reduced, e.g., to below about 0.30 microns, such as less than about 0.25 microns, it is necessary to resort to shorter wavelengths, such as deep ultra-violet light. It is, however, very difficult to form fine line patterns with a maximum dimension of about 0.25 microns or less with any reasonable degree of accuracy, consistency and efficiency, and to produce a controlled sidewall by a simple etching process.

The present invention addresses and solves that problem by initially forming an opening larger than the final targeted maximum dimension of less than about 0.30 microns. For example, in accordance with the present invention, an opening is formed through a dielectric layer, comprising a first dielectric material, on a substrate. The substrate can be another dielectric layer comprising a conductive pattern, or a semiconductor substrate having an active region. If the final targeted dimension is less than about 0.30 microns, the opening is formed with an initial dimension greater than about 0.30 microns, such as about 0.40 microns or greater, employing conventional photolithographic techniques which are accurate and reliable for such oversized dimensions. After the initial oversized opening is formed with an initial dimension greater than the targeted dimension, the initial dimension reduced by depositing a second dielectric material in the opening. The second dielectric material can be the same as the first dielectric material, or the second dielectric material can be different from the first dielectric material. In a preferred embodiment, the second dielectric material is deposited to form a thin film on the first dielectric layer, on the side surface of the initially formed opening and at the bottom of the opening on the substrate.

A simplified anisotropic etching technique is then conducted, such as reactive ion etching, to remove the film of the second dielectric material from the surface of the first dielectric material and from the bottom of the opening thereby exposing the substrate. In this way, the initial opening is reduced to the final targeted opening having a final dimension satisfying a submicron design rule, e.g., less than about 0.30 microns, in a simplified and efficient manner without straining the limits of conventional photolithographic and etching techniques. Hence, the present invention does not rely upon the accuracy of conventional photolithographic and/or etching techniques to form vias/contacts or trenches having a minimal dimension. In this way, openings of about 0.15 microns to less than about 0.30 microns are formed accurately and reliably.

It should be apparent that the simplified method of the present invention does not rely upon the accuracy of conventional photolithographic and/or etching techniques. Thus, in accordance with the present invention, conductive vias/contacts or trenches can be formed with minimal dimensions without relying upon conventional photolithographic and/or etching equipment and techniques. Rather, minimal dimensions are achieved by depositing a thin dielectric layer and blanket anisotropic etching. The present invention, because of its simplicity and efficiency, is also applicable to forming conductive patterns, including vias/contacts or trenches, having relatively large dimensions, including dimensions of 0.30 microns to above 1.0 micron, while advantageously avoiding the use of costly photolithographic and etching equipment.

In accordance with the present invention, conductive patterns comprising conductive lines and/or interwiring spacings having a dimension less than about 0.30 microns are obtained by employing conventional photolithographic techniques, such as I-line photolithography, to accurately form an initial dimension, such as an initial dimension in excess of about 0.40 microns, preferably in excess of about 0.50 microns, which is subsequently reduced to the final targeted dimension. In accordance with the present invention, the initial opening or openings are formed by single and dual damascene techniques.

As shown in FIG. 1, a conventional single damascene technique is employed to form first opening 11 in first dielectric layer 10, comprising a first dielectric material, having an initial first dimension 12. In accordance with the present invention, having targeted a design rule with a maximum dimension of less than about 0.30 microns, trench or via/contact 11 is accurately formed with an initial dimension fully within the capabilities of conventional photolithographic and etching techniques, as for example an initial dimension 12 equal to or greater than about 4.0 microns.

A thin film of a second dielectric material is then deposited on the surface of the first dielectric layer 10, including the side surfaces of first opening 11 to form a sidewall thereon, and on the bottom of the first opening 11. The sidewall of the second dielectric material formed on the side surfaces of first opening 11 effectively reduce the first dimension. The simplicity of the present invention is realized by a blanket anisotropic etching technique which is subsequently performed to remove the thin film of second dielectric material from the surface of the first dielectric layer and from the bottom of the first opening 11, thereby completing the reduction of the initial dimension to the final targeted dimension.

Figure 1A:
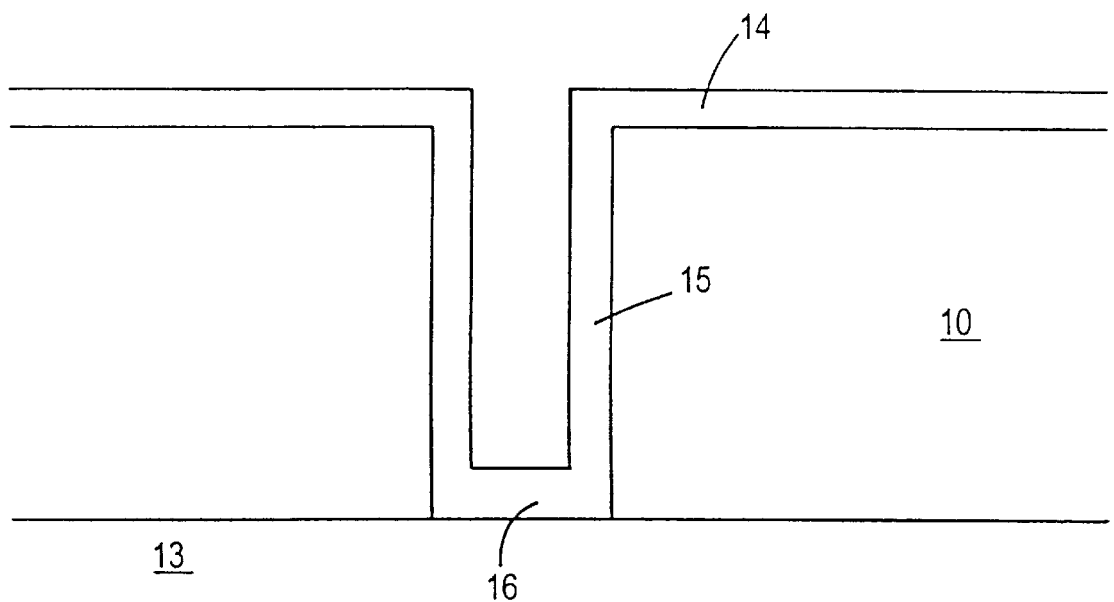
FIG. 1A is a cross-sectional view of a via/contact or trench during an initial stage of an embodiment in accordance with the present invention.
Figure 2:
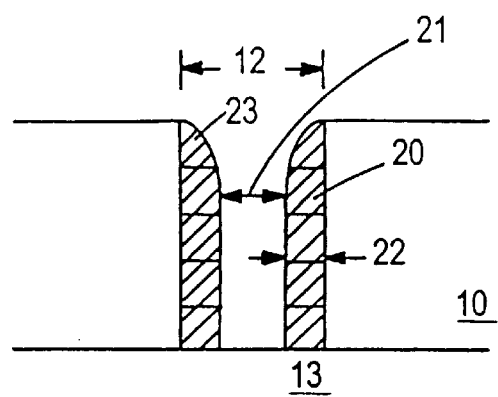
FIG. 2 is a cross-sectional view of a via/contact or trench formed in accordance with an embodiment of the present invention.

As shown in FIG. 1A, a thin film of second dielectric material 14 is deposited on the surface of first dielectric layer 10 and the side surfaces of the opening to form sidewalls 15 and a thin film 16 on the bottom of the opening 11 on substrate 13. As shown in FIG. 2, in accordance with the present invention, the thin film of second dielectric material 20 is formed in first opening 11 to form a first sidewall having a thickness 22, thereby reducing the initial first dimension 12 to a final first dimension 21 defined by the first sidewall which extends through the first dielectric layer from the upper surface to the lower surface. Upon blanket anisotropic etching to remove the thin film of second dielectric material from the surface of the first dielectric layer and the bottom of the first opening 11, a minor portion of the sidewall is reduced which does not materially affect the ultimate objective of forming an opening with a reduced dimension by virtue of the formation of a sidewall of the second dielectric material.

As a result of a simple blanket conventional anisotropic etching, such as reactive ion etching, the final first dimension 21 having a targeted minimal dimension is obtained, such as a final first dimension of less than about 0.30 microns, preferably between about 0.15 microns to about 0.25 microns, defined by a sidewall of second dielectric material 20 having a thickness 22. Thus, a minimal dimension of between about 0.15 and about 0.30 microns is achieved by initially forming an oversized opening in a dielectric layer and reducing the oversized opening to the targeted maximum dimension by forming a thin film of dielectric material as a sidewall in the oversized opening. In this way, an initial opening 11 is reduced by a value approximately equal to twice the thickness of the sidewall 22.

The thickness of the sidewall 22 can be selected to achieve a targeted dimension, depending upon factors such as the size of the initial opening. For example, if an opening with a final targeted dimension of less than about 0.30 microns is desired, the initial opening can be formed with an initial dimension of about 0.40 microns. A thin film of second dielectric material is then deposited, including in the opening. After etching to remove the thin film of second dielectric material from the surface of the first dielectric layer and from the bottom of the initial opening, the final targeted dimension of less than about 0.30 microns is obtained. After formation of an opening having the final targeted dimension, the conductive pattern is completed by depositing a conductive material filling the opening in accordance with conventional practices.

The second dielectric material can be the same as the first dielectric material. However, the present invention provides flexibility by enabling the selection of a second dielectric material different from the first dielectric material. In this way, the second dielectric material can be advantageously selected to provide significant benefits. For example, if dielectric layer 10 comprises a dielectric material having a very low dielectric constant, such material is usually soft and, therefore, may present a source of contamination to conductive material deposited in the opening. Moreover, such soft dielectric material is normally susceptible to penetration by moisture due to its absorption characteristics. The use of soft, moisture absorbent materials adversely affects the integrity and reliability of the resulting semiconductor device. By the present invention, these problems are overcome by selecting a second dielectric material for reducing the initial dimension of the opening which exhibits advantageous properties. In a preferred aspect of this embodiment, a second dielectric material is selected having a hardness and/or density greater than that of the first dielectric material. In this way, the conductive material, preferably a metal, deposited in the opening is protected from contamination from the soft first dielectric material. In another preferred aspect, the second dielectric material is selected which exhibits greater resistance to penetration by moisture than the first dielectric material.

The second dielectric material 20 formed as a sidewall in the initial opening and defining the final targeted dimension 21 can comprise any of various dielectric materials conventionally employed in the manufacture of semiconductor devices, with the desired properties. Such materials include silicon nitride, silicon oxide and silicon oxynitrides, preferably a silicon dioxide formed from deposited TEOS.

Figure 3:
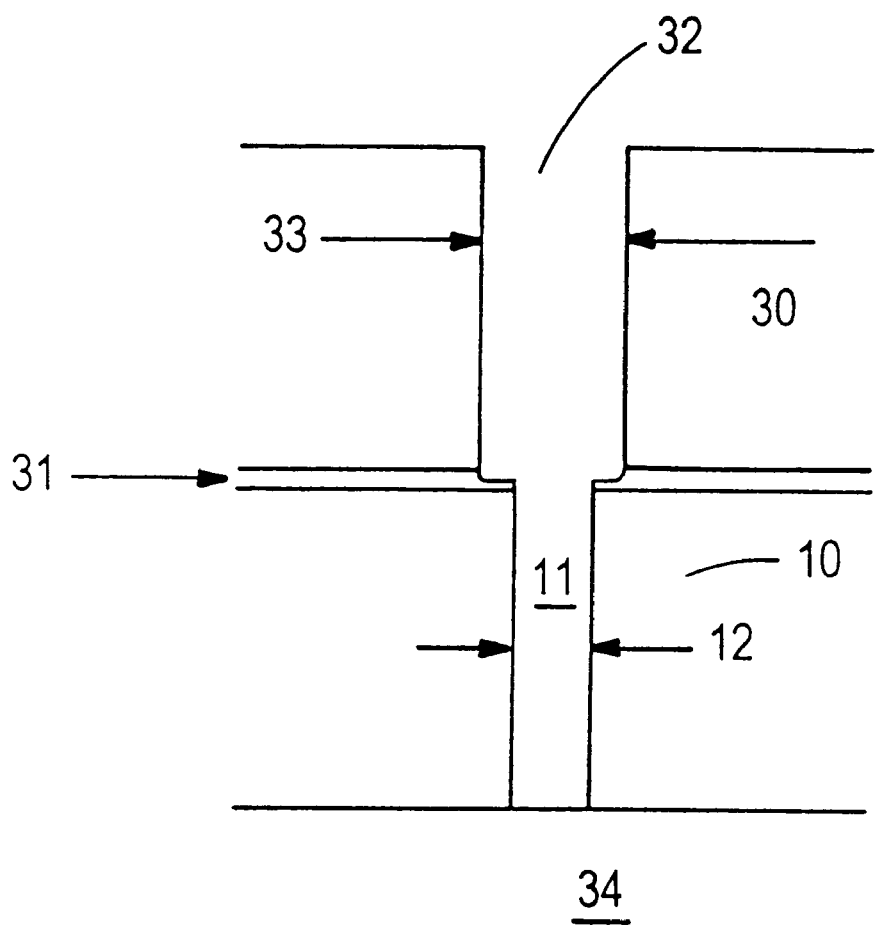
FIG. 3 schematically depicts an interconnection formed by a conventional dual damascene technique.

In accordance with another embodiment of the present invention, a conductive pattern is formed having a minimal dimension of less than about 0.30 microns employing a dual damascene technique. As shown in FIG. 3, a second dielectric layer 30, comprising a third dielectric material, is formed on a first dielectric layer 10, with an optional dielectric film 31 therebetween. The optional dielectric film 31 can function as an etch stop or a polish stop. Depending upon the type of process employed, such as a damascene type of process, an additional optional dielectric film (not shown) can be formed on dielectric layer 30, similar to dielectric film 31, to facilitate processing, such as photolithographic, etching and polishing steps. First opening 11 and second opening 32 are then formed in first dielectric layer 10 and second dielectric layer 30, respectively. In accordance with the present invention, he openings are formed in any conventional manner, preferably by a dual damascene technique. Thus, the first opening 11 and second opening 32 can be formed simultaneously or in any order, i.e., first opening 11 can be formed prior or subsequent to forming second opening 32. First opening 11 is formed with an initial first dimension 12, while second opening 32 is formed with an initial second dimension 33. The initial second dimension 33 can be equal to, less than, or greater than the initial first dimension 12 of first opening 11.

Figure 4:
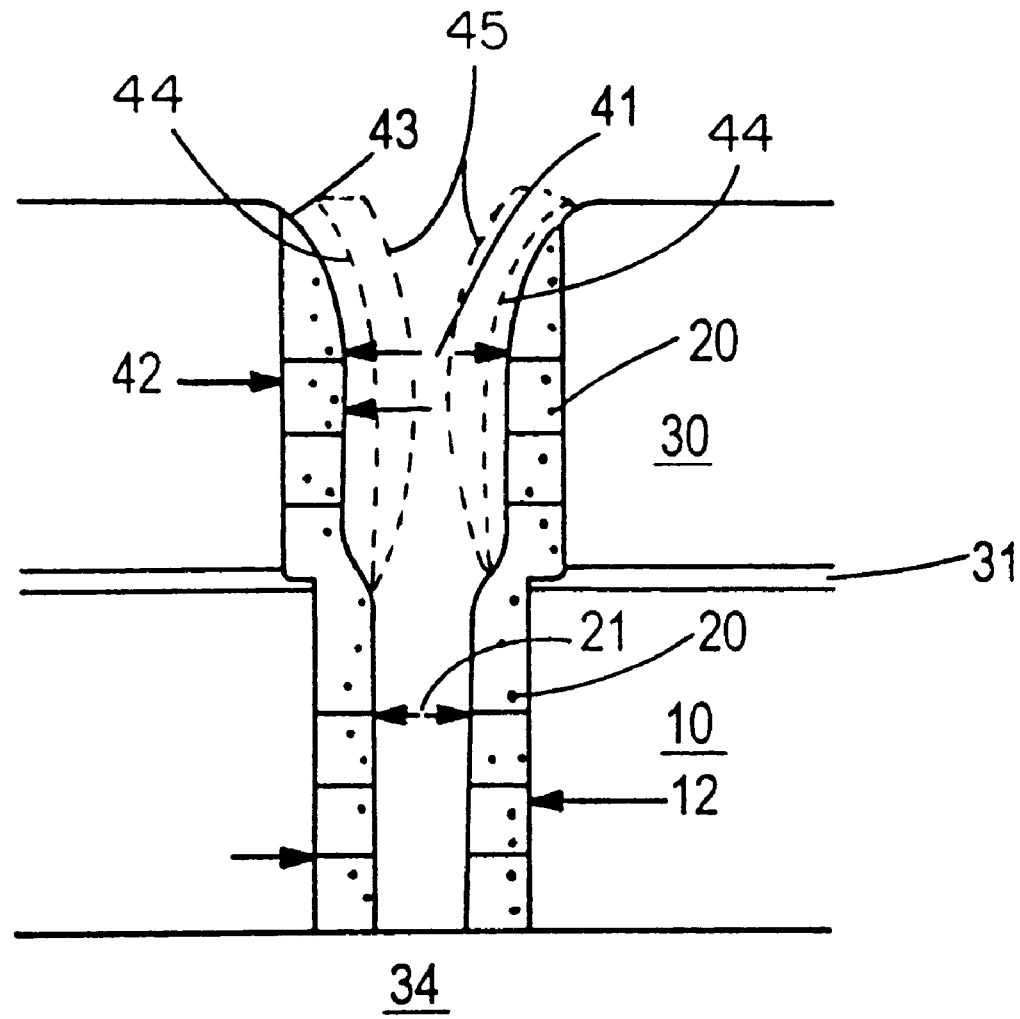
FIG. 4 schematically depicts another embodiment of the present invention for providing an interconnection.

In accordance with the present invention, as illustrated in FIG. 4, a second dielectric material 20 is deposited in first opening 11 to reduce the initial first dimension 12 to a final first dimension 21 defined by a sidewall of the second dielectric material having a thickness 13. Second dielectric material is also deposited in second opening 32 to reduce the initial second dimension 33 to a final second dimension 41.

In a preferred embodiment, a thin film of the second dielectric material 20 is deposited on second dielectric layer 30, on the side surfaces of the first and second openings, and in the bottom of first opening 11 on substrate 34, most preferably in a single step. A conventional anisotropic etching technique is then conducted, such as reactive ion etching, to remove the thin film of dielectric material from the surface of the second dielectric layer 30 and from the bottom of first opening 11 on substrate 34, leaving a sidewall of the thin film of dielectric material on the first and second openings having the minimal targeted dimensions, such as the final first dimension 21 and the final second dimension 41 satisfying the design rule. The advantageous flexibility of the present process enables the selection of the dielectric material to form the sidewalls of the first and second final openings to be different from the material comprising dielectric layer 10 and/or dielectric layer 30. Dielectric layer 10 can be formed of the same dielectric material as dielectric layer 30.

An interconnection structure is, thereby, formed having a lower level first opening with a sidewall of a selected dielectric material in communication with an upper second opening having a sidewall of the selected dielectric material with a thickness 42, wherein the sidewall reliably and accurately reduce the openings which were formed with conventional photolithographic and etching techniques incapable of accurately satisfying the minimum design rule. Thus, a maximum design rule less than about 0.30 microns is accurately satisfied without confronting the accuracy limitations of conventional photolithographic and etching techniques.

Another advantage stemming from the present invention is the formation of openings defined by a smooth and rounded surface at the perimeters of the openings, as seen at 23 in FIG. 2 and at 43 in FIG. 4. Such smooth openings significantly facilitate subsequent filling of the openings with conductive material, such as metal. The thickness of the sidewall can vary widely depending on a particular situation. For example, the thickness of the sidewall can be greater than 0.05 microns, including greater than 0.1 microns.

The various embodiments of the present invention comprise single and dual damascene techniques, wherein the vias and trenches are filled with conductive material conventionally employed in fabricating interconnection structures, such as aluminum, tungsten, copper, and alloys thereof, with and without an adhesion/barrier layer. The conductive material is deposited in the vias/contacts and trenches by techniques which are known in the art. For example, metallization techniques such as various types of chemical vapor deposition (CVD) processes, including low pressure chemical vapor deposition (LPCVD) and plasma enhanced chemical vapor deposition (PECVD) may be employed. Normally, when high melting point metals such as tungsten are deposited, CVD techniques are employed. Low melting point metals, such as aluminum and aluminum-base alloys, including aluminum-copper alloys, may be deposited by melting, reflow or sputtering. Polysilicon can also be employed as a conductive material in the interconnection pattern. The embodiments of the present invention employ known planarization techniques, such as conventional etching and CMP planarization techniques. See, for example, U.S. Pat. Nos. 5,262,354 and 4,944,836, which are incorporated by reference herein in their entirety.

The various embodiments of the present invention involve the formation of openings, such as vias/contacts and trenches, employing conventional photolithographic techniques, including the use of a photoresist mask, etch recipes, and etching techniques as, for example, plasma etching and reactive ion etching. An etch stop layer, such as a nitride layer, preferably silicon nitride ($Si_3N_4$) or a silicon oxynitride, may also be employed consistent with conventional practices. Etch stop layers are conventionally employed in the art of semiconductor manufacturing, as are the methods of metal deposition, e.g., CVD, or plating.

The various embodiments of the present invention involve a conventional semiconductor substrate, such as monocrystalline silicon, and conventional dielectric layers, such as oxide layers, e.g., layers of silicon oxide, formed in a conventional manner, as from deposited tetraethyl orthosilicate (TEOS), thermal oxidation of a deposited silicon layer, PECVD, thermal enhanced CVD and spin-on techniques.

The present invention enables the accurate and reliable formation of conductive patterns having a dimension less than about 0.30 microns, including between about 0.15 microns and about 0.25 microns, employing conventional photolithographic techniques incapable of achieving that dimension. The present invention effectively circumvents the limitations of photolithographic and/or etching techniques, i.e., the difficulty in achieving dimensions less than about 0.30–0.40 microns, with a reasonable degree of accuracy and control. In accordance with the present invention, conventional photolithographic techniques are utilized to form an opening in a dielectric layer having a dimension larger than that targeted. Subsequently, the initial oversized dimension is reduced to the targeted dimension of less than about 0.35 microns.

The present invention, therefore, simplifies the process of forming openings having dimensions of less than about 0.30 microns employing conventional photolithographic and etching techniques. By appropriately selecting the dielectric material employed to reduce the initial opening to a final targeted dimension, metal contamination due to soft dielectric materials can be prevented. In addition, the adverse impact of moisture, which can penetrate certain materials, can be prevented by employing a dielectric material for the sidewall of the opening which is resistant to the penetration of moisture. By intentionally creating an opening with a dimension larger than that targeted, and then reducing the dimension of the opening with a selected dielectric material, the conventional damascene techniques for producing conductive patterns having minimal dimensions is facilitated while avoiding contamination. Thus, the present invention significantly expands the utility of current photolithographic and etching techniques, notwithstanding their inherent limitations, increases the life span of conventional tools, improves step coverage of deposited conductive films, improves product yield by circumventing the minimum size limitation of photolithographic techniques, and improves reliability and performance by providing a capping layer.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of manufacturing a semiconductor device, which method comprises:

forming a first dielectric layer, comprising a first dielectric material, having an upper surface and a lower surface;

forming a first opening in the form of a trench by a single damascene technique through the first dielectric layer extending from the upper surface to the lower surface, having an initial first dimension defined by side surfaces within the first dielectric layer;

depositing a second dielectric material in the first opening to form a first sidewall to reduce the initial first dimension to a final first dimension less than the initial first dimension, so that the final first dimension is defined by the first sidewall; and depositing a conductive material filling the trench to form a substantially horizontal conductive line of a conductive pattern sandwiched by the second dielectric material.

2. The method according to claim 1, wherein the second dielectric material is the same as the first dielectric material.

3. The method according to claim 1, wherein the second dielectric material is different from the first dielectric material.

4. The method according to claim 3, wherein the second dielectric material has a hardness and/or density greater than that of the first dielectric material.

5. The method according to claim 3, wherein the second dielectric material has a greater resistance to moisture penetration than the first dielectric material.

6. The method according to claim 1, wherein the second dielectric material is selected from the group consisting of silicon dioxide, silicon nitride and silicon oxynitrides.

7. The method according to claim 6, wherein the second dielectric material comprises silicon dioxide derived from deposited tetraethyl orthosilicate.

8. The method according to claim 1, further comprising blanket anisotropic etching subsequent to depositing the second dielectric material.

9. A method of manufacturing a semiconductor device, which method comprises:

forming a first dielectric layer, comprising a first dielectric material, having an upper surface and a lower surface;

forming a second dielectric layer, comprising a third dielectric material, on the first dielectric layer, the second dielectric layer having an upper surface and a lower surface on the first dielectric layer;

forming openings through the first and second dielectric layers, including a first opening through the first dielectric layer extending from the upper surface to the lower surface and having an initial first dimension defined by side surfaces within the first dielectric layer and a second opening, in the form of a trench by a single damascene technique, through the second dielectric layer extending from the upper surface to the lower surface of the second dielectric layer, wherein the second opening communicates with the first opening, and the second opening has an initial second dimension defined by side surfaces within the second dielectric layer;

depositing a second dielectric material in the first and second openings to form a sidewall to reduce the initial first and second dimensions to a final first and second dimensions less than the initial first and second dimensions, so that the final first and second dimensions are defined by the sidewall; and depositing a conductive material filling said first and second openings, wherein the conductive material filling the second opening forms a conductive line sandwiched by the second dielectric material.

10. The method according to claim 9, wherein the first dielectric material is the same as the third dielectric material.

11. The method according to claim 9, wherein the first dielectric material is different from the third dielectric material.

12. The method according to claim 9, wherein the final second dimension is the same as the final first dimension.

13. The method according to claim 9, wherein the final second dimension is less than the final first dimension.

14. The method according to claim 9, wherein the final second dimension is greater than the final first dimension.

15. The method according to claim 9, wherein the final second dimension is less than about 0.30 microns.

16. The method according to claim 14, wherein the final second dimension is about 0.15 to about 0.20 microns.

17. The method according to claim 9, further comprising depositing a dielectric film on the upper surface of the first dielectric layer prior to depositing the second dielectric layer.

18. The method according to claim 9, comprising forming the openings by a dual damascene technique.

19. The method according to claim 9, comprising forming the first opening and the second opening simultaneously.

20. The method according to claim 9, comprising forming the first opening before forming the second opening.

21. The method according to claim 9, comprising forming the second opening before forming the first opening.

22. The method according to claim 9, further comprising blanket anisotropic etching subsequent to depositing the second dielectric material.

* * * * *